United States Patent
Huijsing et al.

(10) Patent No.: US 8,179,195 B1
(45) Date of Patent: May 15, 2012

(54) CURRENT-FEEDBACK INSTRUMENTATION AMPLIFIERS

(75) Inventors: Johan Hendrik Huijsing, Schipluiden (NL); Rong Wu, Delft (NL); Kofi A. A. Makinwa, Delft (NL)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 13/012,550

(22) Filed: Jan. 24, 2011

(51) Int. Cl.
*H03F 1/02* (2006.01)
(52) U.S. Cl. .......... 330/9; 330/124 R; 330/295; 330/126
(58) Field of Classification Search .......... 330/9, 124 R, 330/295, 126
See application file for complete search history.

(56) References Cited

U.S. PATENT DOCUMENTS

| | | | | |
|---|---|---|---|---|
| 4,475,103 | A * | 10/1984 | Brokaw et al. | 340/501 |
| 5,410,274 | A * | 4/1995 | Birdsall et al. | 330/265 |
| 7,573,327 | B1 * | 8/2009 | Pertijs et al. | 330/9 |
| 7,696,817 | B1 * | 4/2010 | Boucher et al. | 330/9 |
| 7,834,685 | B1 * | 11/2010 | Pertijs | 330/9 |

OTHER PUBLICATIONS

Blanken, Peter G., et al., "A 10μV-Offset 8kHz Bandwidth 4th-Order Chopped ΣΔ A/D Converter for Battery Management", *ISSCC Dig. Tech. Papers, 2002 IEEE International Solid-State Circuits Conference*, Session 23, Analog Techniques, 23.5, (Feb. 6, 2002), pp. 388-389.

Fan, Qinwen, et al., "A 21nV/√Hz Chopper-Stabilized Multipath Current-Feedback Instrumentation Amplifier with 2μV Offset", *ISSCC Dig. Tech. Papers, 2010 IEEE International Solid-State Circuits Conference*, Session 4, Analog Technologies, 4.4, (Feb. 8, 2010), pp. 80-81.

National Semiconductor, "LMP8358 Zero-Drift, Programmable Instrumentation Amplifier with Diagnostics", (May 5, 2010), pp. 1-31.

Pertijs, Michiel A.P., et al., "A 140dB-CMRR Current-Feedback Instrumentation Amplifier Employing Ping-Pong Auto-Zeroing and Chopping", *ISSCC Dig. Tech. Papers, 2009 IEEE International Solid-State Circuits Conference*, Session 19, Analog Techniques, 19.2, (Feb. 10, 2009), pp. 324-325.

Witte, J. F., et al., "A Current-Feedback Instrumentation Amplifier with 5μV Offset for Bidirectional High-Side Current-Sensing", *ISSCC Dig. Tech. Papers, 2008 IEEE International Solid-State Circuits Conference*, Session 3, Filters and Amplifiers, 3.5, (Feb. 4, 2008), pp. 74-75, 596.

Wu, Rong, et al., "A Chopper Current-Feedback Instrumentation Amplifier With a 1 mHz 1/f Noise Corner and an AC-Coupled Ripple Reduction Loop", *IEEE Journal of Solid-State Circuits*, vol. 44, No. 12, (Dec. 2009), pp. 3232-3243.

\* cited by examiner

*Primary Examiner* — Patricia Nguyen
(74) *Attorney, Agent, or Firm* — Blakely Sokoloff Taylor & Zafman LLP

(57) ABSTRACT

Current-feedback instrumentation amplifiers that include dynamic element matching for the input transconductance amplifiers by periodically swapping the transconductance amplifiers between the instrumentation amplifier input and the feedback input. The instrumentation amplifiers may include a gain error reduction loop, which loop corrects differences in the gains of the input transconductance amplifiers and eliminates the ripple in the instrumentation amplifier output caused by the dynamic element matching. If chopper stabilization is used, the amplifiers may also include an offset reduction loop. Various embodiments are disclosed.

27 Claims, 6 Drawing Sheets

CURRENT-FEEDBACK INSTRUMENTATION AMPLIFIERS

BACKGROUND OF THE INVENTION

1. Field of the Invention

The present invention relates to the field of current Feedback instrumentation amplifiers.

2. Prior Art

The notation $G_m$ as used in this disclosure refers to a transconductance amplifier, used in plurality to construct and instrumentation amplifier.

Instrumentation amplifiers (IA) are frequently used in sensor interfacing and current sensing. Current feedback instrumentation amplifiers (CFIA) gain favor because they can combine low noise and low supply power with an intrinsic high CMRR (common mode rejection ratio). The combination of low noise and low supply power is only true if their differential input stages are not being degenerated. However, non-degenerated input stages exhibit a mismatch which over temperature is not better than 2% untrimmed and 0.2% trimmed. The inaccuracy of these amplifiers directly depends on the gain mismatch of the two input stages. For most Instrumentation Amplifier applications, this inaccuracy is too high.

FIG. 1 is a block diagram of a prior art chopper current feedback instrumentation amplifier. The first input stage $G_{m21}$ connects to the input through chopper $Ch_{21}$, while the second input stage $G_{m22}$ connects to a feedback attenuator $R_1$ and $R_2$ at the output through chopper $Ch_{22}$. The ratio of the gains of the input stages divided by the attenuation of the output attenuator determines the overall gain.

The voltage-to-current functions of the input $G_m$'s isolate the common mode input voltage from the common mode output voltage. This results in an intrinsic high common mode rejection ratio without the need of a resistor bridge that needs to be trimmed.

The input stages will have offset voltages $V_{os21}$ and $V_{os22}$. When choppers $Ch_1$ and $Ch_{21}$ and $Ch_{22}$ are placed around the input stages, the average offset will be greatly reduced and the CMMR will be greatly enlarged (the offset $V_{os1}$ of $G_{m1}$ is divided down by the gain of $G_{m21}$ and is of no substantial consequence). However, a ripple will result in the output voltage. A Ripple Reduction Loop (RRL) can be applied to kill the ripple. For this purpose, two capacitors $C_{s31}$ and $C_{s32}$ sense the ripple voltage at the Instrumentation Amplifier output. Their current is synchronously demodulated by a chopper $Ch_3$, and the demodulated current is integrated on the capacitors $C_{41}$ and $C_{42}$ connected around the $G_{m4}$, or alternatively, one capacitor connected across the differential output of a current buffer CB4. The output voltage of the integrator represents the amplified offset. This offset is fed back to the output of the input stages through the correction amplifier $G_{m3}$. If the loop gain is high, the offset and ripple nearly completely vanish. The offset and ripple can both be reduced by a factor 100 to 1000.

DETAILED DESCRIPTION OF THE PREFERRED EMBODIMENTS

Figure 1:
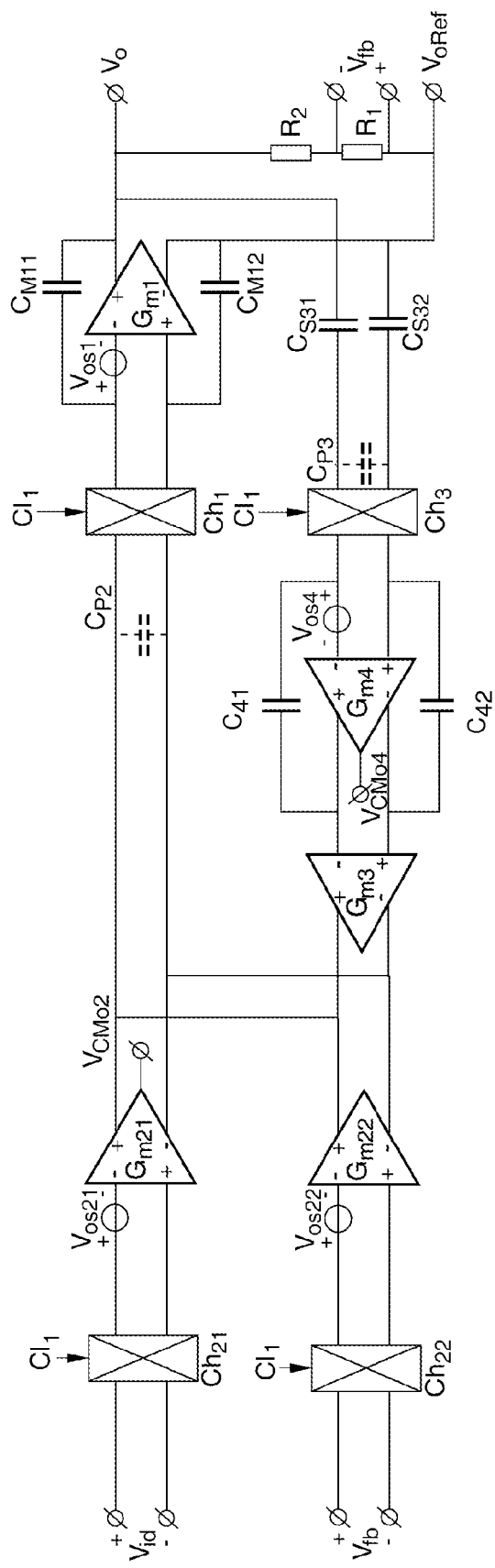
FIG. 1 is a block diagram of a prior art chopper Current Feedback Instrumentation Amplifier (CFIA).
Figure 2:
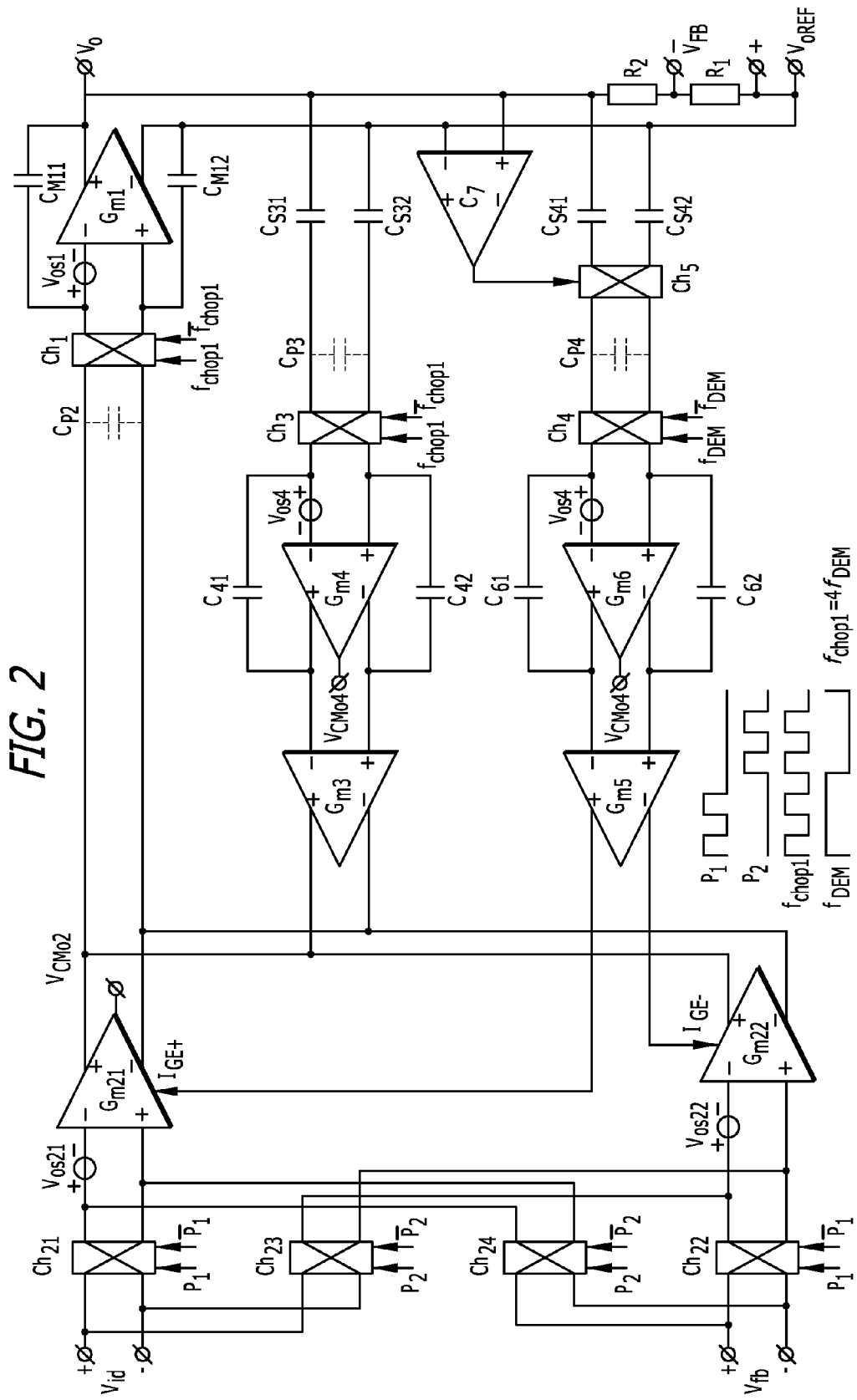
FIG. 2 illustrates one embodiment of the Gain-Error Reduction Loop (GERL) of the present invention in a chopper Current Feedback Instrumentation Amplifier.

FIG. 2 illustrates one embodiment of the Gain-Error Reduction Loop (GERL) of the present invention in a current feedback instrumentation amplifier. For obtaining an optimal combination of low noise and low supply current, the input stages are composed of differential transistor pairs without resistive degeneration, and exemplary embodiment of which will subsequently be described. However, as previously mentioned, such input stages will show a substantial gain mismatch, which over temperature, may be of the order of 2% untrimmed or 0.2% when trimmed. In order to reduce the mismatch, Dynamic Element Matching (DEM) is applied to the input stages. This may be performed by 4 input choppers $Ch_{21}$ through $Ch_{24}$ which connect the input stages $G_{m21}$ and $G_{m22}$ to the input and via the attenuator R1/(R1+R2) to the output, respectively. After each full chopper clock cycle, or after a number of full chopper clock cycle (2 being illustrated in FIG. 2), the connections to the input and feedback are interchanged, effectively swapping $G_{m21}$ and $G_{m22}$ and an equal number of additional full chopper cycles are executed, with the sequence being continually repeated with the same or different numbers of full chopper clock cycles. The straight through input connections of $G_{m21}$ and $G_{m22}$ are performed by engaging choppers $Ch_{21}$ and $Ch_{22}$ while choppers $Ch_{23}$ and $Ch_{23}$ are inactive (at least their outputs are open circuited, i.e., present no load on the output of the other two choppers), and the swapped connections of $G_{m21}$ and $G_{m22}$ is performed by engaging choppers $Ch_{23}$ and $Ch_{24}$ while choppers $Ch_{21}$ and $Ch_{22}$ are inactive Alternatively, two choppers and two multiplexers could be used for the same function. This swapping of $G_{m21}$ and $G_{m22}$ greatly reduces the average gain mismatch (more than a factor 100). In particular, with the swapping, typically at a frequency that shall subsequently referred to herein as $f_{DEM}$, the average gain in the input path and the feedback path are nominally both the average gain of $G_{m21}$ and $G_{m22}$, respectively. However, a mismatch in gain between $G_{m21}$ and $G_{m22}$ will result in a ripple in the output of the current feedback instrumentation amplifier at the frequency at which $G_{m21}$ and $G_{m22}$ are swapped, which is the DEM frequency $f_{DEM}$.

It can be seen from the above that the word "swap" in its various forms is used herein and in the claims to follow in the context of changing the inputs of $G_{m21}$ and $G_{m22}$ from the differential input of the CFIA and the differential feedback, respectively, to the differential feedback and the differential input of the CFIA, respectively, and vice versa. In cases where the positive and negative connections of a differential output of one element need at times to be controllably connected to the negative and positive connections of the differential input of the next element in the circuit, this is referred to herein and in the claims to follow as reversing the interconnection of the sides of the differential signal, or in terms of "polarity", and not as swapping the sides of the differential signal.

To remove the ripple resulting from the mismatch of the gains of $G_{m21}$ and $G_{m22}$ described above, a feedback loop is applied to continuously correct the gain mismatch of the input stages $G_{m21}$ and $G_{m22}$, similar to the removal of offset by the ripple reduction loop. The capacitors $C_{s41}$ and $C_{s42}$ in the gain error reduction loop sense the output gain ripple caused by the dynamic element matching function. The current through the capacitors is synchronously demodulated by chopper $Ch_4$ at the DEM frequency $f_{DEM}$ and integrated on the capacitors $C_{61}$ and $C_{62}$ around $G_{m6}$. The output voltage of $G_{m6}$ represents the product of the mismatch in the gain of $G_{m21}$ and $G_{m22}$ and the signal amplitude, and thus is also signal polarity dependent. The correction of the gain mismatch is realized by correction amplifier $G_{m5}$, which varies the tail currents of the two input stages $G_{m21}$ and $Gm_{22}$ by its differential output current to equalize the gains of $G_{m21}$ and $G_{m22}$. If the DEM loop gain is high, the output DEM ripple nearly vanishes, the gain mismatch automatically greatly reduces, and the overall gain is highly accurate.

As noted above, the DEM loop gain is a function of the signal amplitude, and polarity. Therefore, a comparator $C_7$ is used to sense the polarity of the output signal and correct the loop polarity by driving chopper $Ch_5$ which reverses the interconnection of the sides of the differential signal when required. If the signal is too small, the loop gain will be low because the ripple is low and the correction is weak. On the other hand, a low output $f_{DEM}$ ripple does not matter too much. Techniques to keep the output signal accurate at low signal amplitudes can be applied, as shall be subsequently be described.

The gain error reduction loop's gain is zero for zero input. In this state, leakage causes the gain error correction factor stored on capacitors $C_{61}$ and $C_{62}$ to drift with a time constant of several seconds, meaning that the gain error reduction loop has to re-settle whenever a finite input signal re-appears, which re-settling will occur, for example, within 10 ms for a 20 mV step input at a current feedback instrumentation amplifier with a gain of 200.

To avoid the need for re-settling, a leakage-free or drift free digital integrator can be used. The result is a general digitally-assisted gain error reduction loop shown in FIG. 3a. In this embodiment, the analog integrator ($G_{m6}$ and capacitors $C_{61}$ and $C_{62}$ of FIG. 2) is replaced by an ADC (analog to digital converter), a Digital Integrator and a DAC (digital to analog converter). The Digital Integrator in this embodiment receives a digital value from the analog to digital converter (ADC), which may be a single bit, or a multiple bit signal for faster settling of the loop, and is clocked by the clocking signal labeled $f_{DEM}/N$.

The Digital Integrator is provided with a dead zone (output of the Digital Integrator is frozen) by an enable output of three level comparator Q2 disabling the Digital Integrator when the output of the CFIA is in a region around zero, which avoids integrator drift for as long as the output of the CFIA remains in the region around zero. Also of course, in this embodiment, the positions of the choppers $CH_9$ and $CH_{10}$ may be reversed without affecting the operation of the gain error correction loop.

Figure 3A:
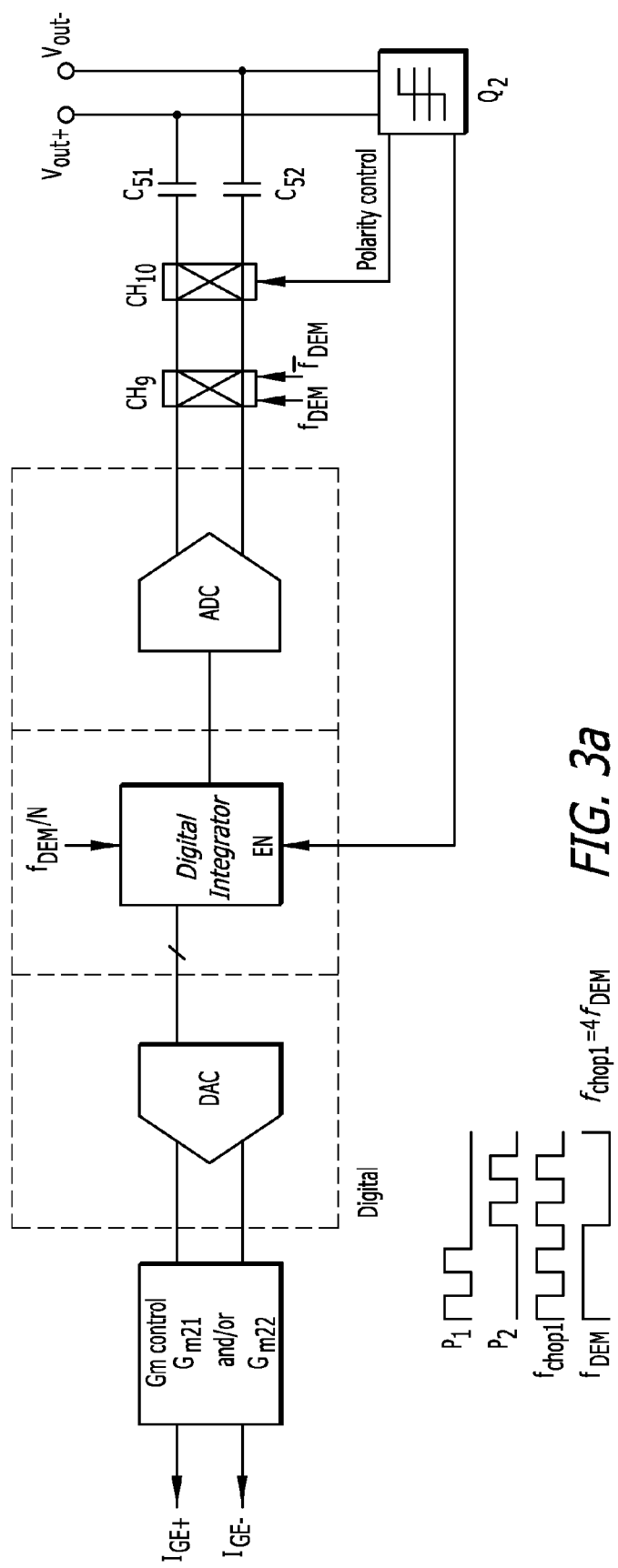
FIG. 3a illustrates a general digitally-assisted gain error reduction loop that may be used in the chopper Current Feedback Instrumentation Amplifier of FIG. 2.
Figure 3B:
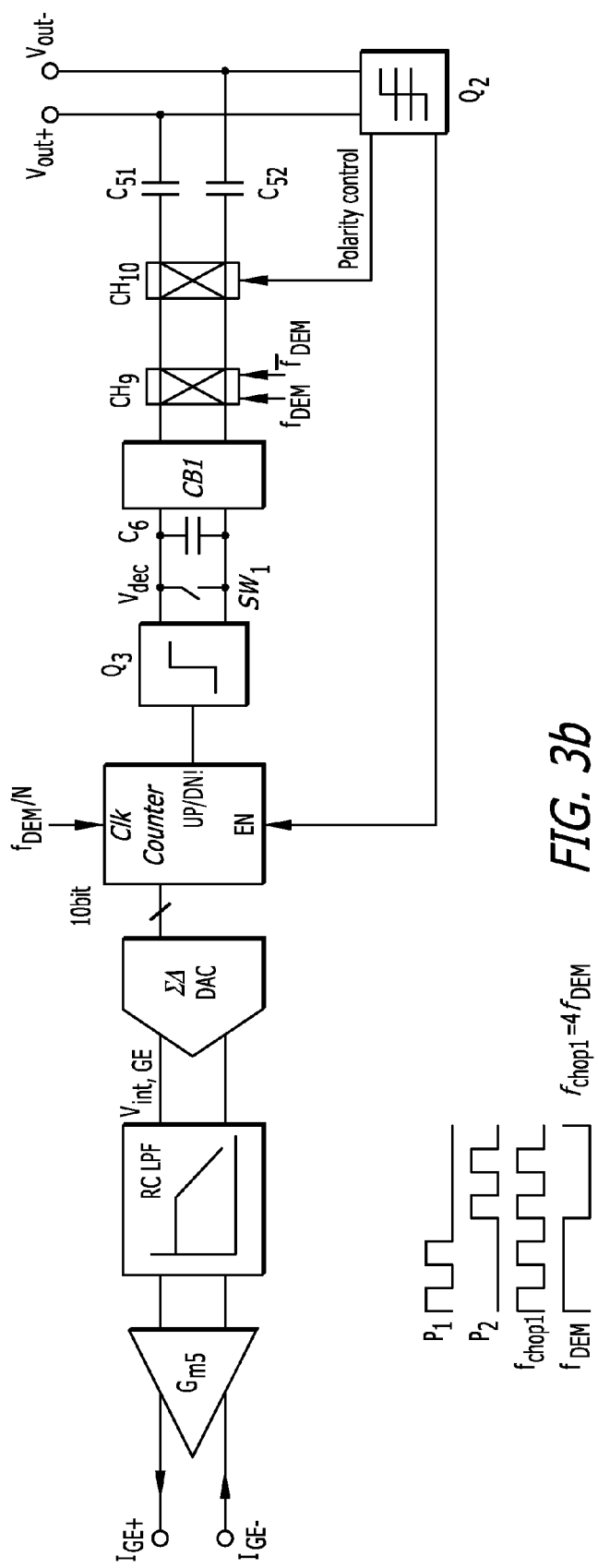
FIG. 3b illustrates a specific implementation of a digitally-assisted gain error reduction loop that may be used in the chopper Current Feedback Instrumentation Amplifier of FIG. 2.
Figure 4:
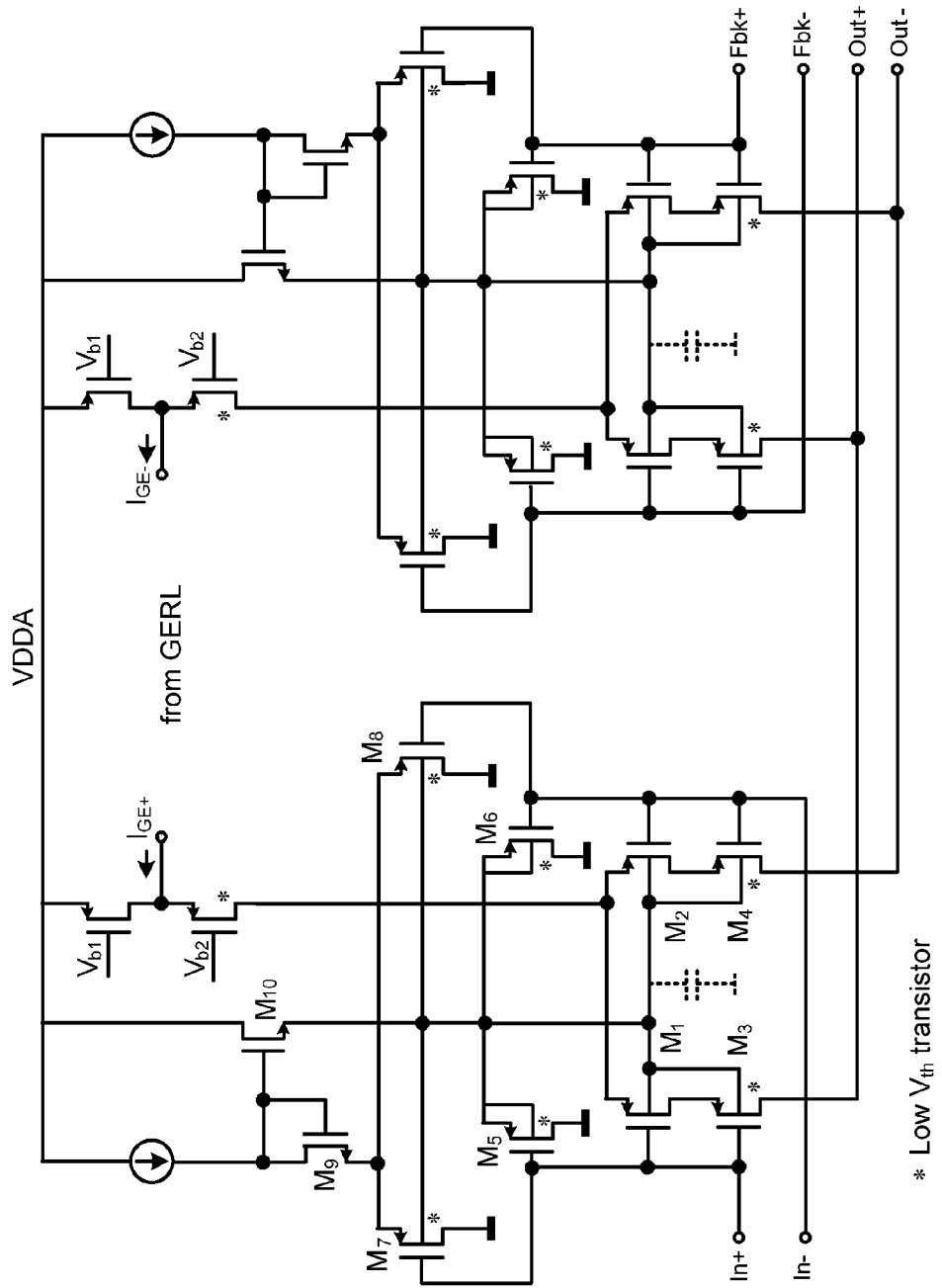
FIG. 4 is a circuit diagram for the input $G_{m21}$ and $G_{m22}$ that may be used in the current feedback instrumentation amplifier of FIG. 2.

FIG. 3b illustrates a specific implementation for the generalized digital version of FIG. 3a. In this implementation, the ADC function of FIG. 3a is done by an integrate-and-dump pre-amplifier (current buffer CB1, capacitor $C_6$ and switch $SW_1$) and comparator ($Q_3$). The UP/DN! Counter functions as a one bit Digital Integrator, and the 1-bit 1st order $\Sigma\Delta$ DAC with RC LPF low pass filters function as the DAC of FIG. 3a. The integrate-and-dump pre-amplifier is used to integrate the demodulated DEM ripple on $C_6$ for, for example, seven DEM periods. The comparison is then made by comparator $Q_3$. At the beginning of the next DEM period, $SW_1$ resets the voltage on $C_6$. The comparator's output increments or decrements the 10-bit counter, whose output drives the DAC. The 3-level quantizer $Q_2$ controls the polarity of the loop via $CH_{10}$ and also ensures that the integrator (counter) state is "frozen" for small (in one embodiment, <8 mV) current feedback instrumentation amplifier output signals. In this context, small means that the gain in the ripple reduction loop is or is approaching too low a value to obtain meaningful input amplifier gain corrections for further ripple reduction. Thus an integrator hold mode is created between the positive gain and the negative gain conditions, i.e., in a region around a zero output of the CFIA. At steady state, when not frozen, the DAC's output will toggle between two LSBs. For example, 10-bit resolution is enough to ensure that the resulting tone is well below the current feedback instrumentation amplifier's noise level and that the DEM ripple can be reduced to the same level as the analog gain error reduction loop. Since the counter is updated at a rate of, for example, $f_{DEM}/8=1$ kHz, the digitally-assisted GERL has a 1s (worst-case) start-up time. The outputs of the digital gain error reduction loop $I_{GE+}$ and $I_{GE-}$ are the gain correction currents for $G_{m21}$ and $G_{m22}$ as shown in FIGS. 2 and 4.

Thus, in the embodiment of FIG. 2, the integration of $G_{m6}$ is an analog integration, which is subject to drift in the near zero loop gain conditions, while in FIGS. 3a and 3b, the integration is a digital integration with a hold mode in the digital integration to avoid integrator drift in the near zero loop gain condition.

It should be noted that in FIGS. 2, 3a and 3b, the inversion for negative gain done by Ch5 (FIG. 2) and Ch$_{10}$) (FIGS. 3a and 3b) can be done anywhere prior to the analog or digital integrator. For instance, an exclusive OR (XOR) gate between the comparator Q3 and the counter of FIG. 3b with one input of the gate being 1 for inversion and 0 for no inversion would accomplish the desired inversion. Putting the inversion after the integrator would cause an undesirable 2 delta jump in gain error with a relatively slow integrator recovery.

Also it should be noted that in the embodiments disclosed herein, a differential gain error correction signal is generated and used to adjust the gain of both $G_{m21}$ and $G_{m22}$ to make their gains equal. However adjusting the gains of both transconductance amplifiers is not necessary, as the gains may be made equal by not changing the gain of one of the transconductance amplifiers and simply adjusting the gain of the other transconductance amplifier to match that gain. Accordingly the feedback from the gain error reduction loop may be single ended to adjust the gain of one amplifier only and still achieve the desired object of this aspect of the invention.

The use of DEM (dynamic element matching) and the GERL (gain error reduction loop) ensures good gain accuracy, which means that the input transconductors can be implemented as power-efficient PMOS differential pairs, as shown in FIG. 4. Since the input and feedback stages typically operate at different common-mode (CM) voltages, their CMRR (common mode rejection ratio) can be enhanced by cascoding the input transistors $M_1$ and $M_2$ with low-threshold devices $M_3$ and $M_4$, respectively. During the DEM transitions, the common mode voltages of the $G_m$ stages ($G_{m21}$ and $G_{m22}$ of FIG. 2) change abruptly. As a result, the parasitic capacitances between the substrate and the n-wells of the input devices must be charged and discharged, causing large common mode current spikes in the input stages. To divert these spikes, the n-wells of the input transistors $M_1$, $M_2$, and their cascodes $M_3$, $M_4$ are actively bootstrapped by class-AB buffers consisting of $M_5$-$M_{10}$. $M_7$-$M_9$ act as level shifters to accommodate the bias voltage of the class-AB stages. The source followers $M_5$ and $M_6$ provide a low-impedance path to ground, while $M_{10}$ provides a low-impedance path to the supply. As a result, the bootstrap circuit effectively diverts the DEM spikes to the supply rails.

The advantages of a gain error reduction loop in accordance with the present invention over other techniques that improve the gain accuracy include the following. The dynamic element matching combined with gain error reduction loop has the potential to achieve high power efficiency. The reasons can be described as follows.

Firstly, since applying dynamic element matching (DEM) to the two input stages ensures good gain accuracy, this means that the input stages can be implemented as simple and power efficient PMOS differential pairs.

Secondly, chopping is a modulation technique incurring no noise folding. Therefore, it is preferred over auto-zeroing due to its superior low-frequency noise performance.

Thirdly, the noise contribution of the gain error reduction loop is negligible, since by way of example, $G_{m5}=G_{m3}/400$ by design. Furthermore, the gain-compensation current from the gain error reduction loop is injected at the tail currents of the input and feedback input stages $G_{m3}$ and $G_{m4}$. Therefore, the noise is suppressed by the finite CMRR of the input stages, although it varies with different input signals. When the input signal of the current feedback instrumentation amplifier is close to zero, the differential currents flowing through the input pairs are almost zero, thus the CMRR is high (130 dB). When the input signal increases, the differential pair flowing with differential currents becomes unbalanced, thus the CMRR drops.

The current feedback instrumentation amplifier employs a continuous-time gain error cancellation, thus eliminating the need of trimming. Instead of one-point temperature trimming, the gain error reduction loop acts as multi-point temperature trimming, thus effectively removing the temperature coefficient of the gain.

For a stand-alone current feedback instrumentation amplifier, applying DEM combined with gain error reduction loop effectively eliminates the output signal-dependent DEM ripple. Therefore it can be interfaced with any kind of ADC, without the need to consider the synchronization between the amplifier and the ADC.

Figure 5:
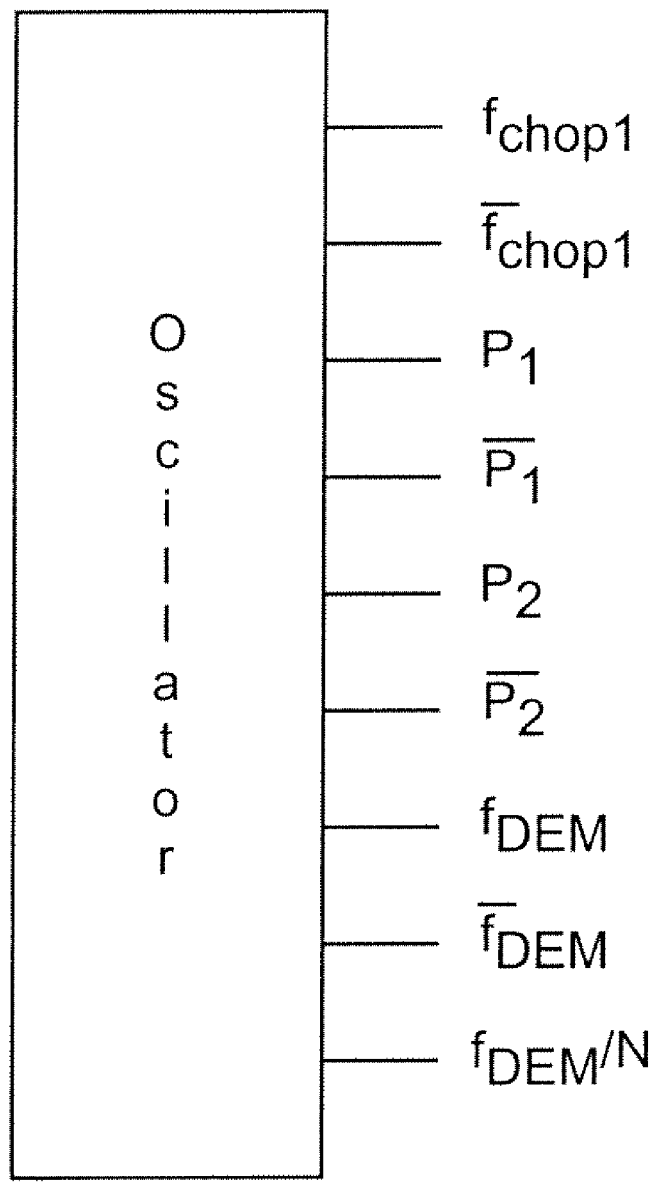
FIG. 5 is a schematic illustration of an oscillator that may be used to generate the chopper drive signals for an embodiment of the present invention.

A ripple reduction loop (RRL) and the gain error reduction loop (GERL) work independent of each other at two different frequencies, a factor 4 apart in FIG. 2. The DEM frequency may be ½, ¼, ⅛, etc., of the chop frequency, depending of the time-constant choices. When both loops are functioning, both the offset and gain mismatch of the input stages are greatly reduced. This makes the curved transfer functions of the differential transistor input stages lay precisely on top of each other, greatly reducing the effect of the inherent non-linearity of each differential pair of transistors in the two input stages. FIG. 5 is a schematic illustration of an oscillator that may be used to generate the chopper drive signals for an embodiment of the present invention. A single oscillator circuit with frequency dividers can be used, as all frequencies for an embodiment of the invention like that of FIG. 2 can be generated by dividing down a single frequency.

In the current feedback instrumentation amplifier of FIG. 2, there is only one $G_m$ stage between the input stages $G_{m21}$ and $G_{m22}$ and the instrumentation amplifier output. Obviously additional stages may be added as desired, which states may themselves be chopper stabilized if desired.

The use of DEM (dynamic element matching) by periodically swapping the two input transconductance amplifiers between the signal input and the feedback input ensures good (average) gain accuracy. This may be advantageously used with or without chopping, the embodiments disclosed in detail herein being with chopping. Similarly, the GERL (gain error reduction loop) used with the dynamic element matching ensures good gain accuracy, which may also be advantageously used with or without chopping, the embodiments disclosed in detail herein also being with chopper stabilization. When using the gain error reduction loop with the dynamic element matching, the frequency $f_{DEM}$ is the frequency of the periodic swapping the two input transconductance amplifiers between the signal input and the feedback input. Finally, the ripple reduction loop cancels the effect of the zero offset of transconductor $G_{m21}$ and $G_{m21}$ and is only useable with chopper embodiments. Since chopping is only necessary for canceling the effect of the zero offset, the chopping frequency is not dependent on the frequency of the dynamic element matching ($f_{DEM}$) and of the DEM) gain error reduction loop, and can be higher or lower than $f_{DEM}$, though should be different than $f_{DEM}$.

Finally, note that while instrumentation amplifiers commonly have a differential input as in the embodiments disclosed herein, they may in fact be used with a single ended input simply by connection one input to a circuit ground, such as the circuit ground of the source of the single ended input signal. Also while the feedback input $V_{fb}$ has been referred to herein as a differential input, note that the output connection $V_{oREF}$ may well be a circuit ground, such as the circuit ground for the circuit to which the output of the CFIA is connected, thereby effectively making the CFIA output a single ended output, though clearly the output of the CFIA could also be a true differential output as is well known in the art.

Thus the present invention has a number of aspects, which aspects may be practiced alone or in various combinations or sub-combinations, as desired. While certain preferred embodiments of the present invention have been disclosed and described herein for purposes of illustration and not for purposes of limitation, it will be understood by those skilled in the art that various changes in form and detail may be made therein without departing from the spirit and scope of the invention as defined by the full breadth of the following claims.

What is claimed is:

1. A current feedback instrumentation amplifier (CFIA) having a differential signal input, a differential feedback input and an output comprising:

first and second transconductance amplifiers, each having a differential input and a differential output;

the first and second transconductance amplifiers having their differential outputs coupled together and to the output of the CFIA;

first circuitry coupled to the differential signal input and the differential feedback input to periodically swap the differential inputs of the first and second transconductance amplifiers between the differential signal input and the differential feedback input, respectively, at a first frequency.

2. The CFIA of claim 1 further comprising:

a comparator having an input coupled to the output of the CFIA;

second circuitry coupled to an output of the comparator and to the output of the CFIA, the second circuitry chopping an output signal of the CFIA at the first frequency and coupling the chopped signal to a gain control input of the first and/or second transconductance amplifiers with a polarity responsive to an output of the comparator.

3. The CFIA of claim 2 wherein the second circuitry is capacitively coupled to the output of the CFIA.

4. The CFIA of claim 3 wherein the output of the second circuitry is coupled to a gain control input of the first and/or second transconductance amplifiers through a first integrator.

5. The CFIA of claim 4 wherein the first integrator is an analog integrator.

6. The CFIA of claim 4 wherein the first integrator is a digital integrator preceded by an analog to digital converter and followed by a digital to analog converter.

7. The CFIA of claim 6 wherein the operation of the first integrator is frozen in a region around a zero output of the CFIA.

8. The CFIA of claim 1 further comprising:
a comparator having an input coupled to the output of the CFIA and an output having a comparison output and a digital integrator enable output;
an analog to digital converter;
second circuitry coupled to the comparison output of the comparator, to the output of the CFIA and to the analog to digital converter input, the second circuitry to demodulate a signal at the output of the CFIA at a first frequency and to couple the demodulated signal to an input of an analog to digital converter with a polarity responsive to the comparison output of the comparator;
an analog to digital converter output being coupled to an input of a digital integrator;
the digital integrator, when enabled, integrating the output of the analog to digital converter;
a digital to analog converter having an input coupled to an output of the digital integrator and an output coupled to a gain control input of the first and/or second transconductance amplifiers.

9. The CFIA of claim 8 wherein the second circuitry is capacitively coupled to the output of the CFIA.

10. The CFIA of claim 1 further comprising:
a comparator having an input coupled to the output of the CFIA and an output having a comparison output and a counter enable output;
a counter having an enable input coupled to the counter enable output of the comparator and an up/down counter input;
second circuitry coupled to the comparison output of the comparator, to the output of the CFIA and to the up/down counter input, the second circuitry to demodulate a signal at the output of the CFIA at a first frequency and to couple the demodulated signal to the up/down counter input with a polarity responsive to the comparison output of the comparator;
the counter, when enabled, counting up or down responsive the up/down counter input;
a digital to analog converter having an input coupled to the output of the counter and an output coupled to a gain control input of the first and/or second transconductance amplifiers.

11. The CFIA of claim 1 further comprising:
a first chopper:
the first circuitry being coupled to the differential signal input and the differential feedback input to chop the differential signal input and the differential feedback input at a second frequency, and to swap the differential inputs of the first and second transconductance amplifiers between the chopped differential signal input and the chopped differential feedback input, respectively, at the first frequency;
the first chopper being coupled between the outputs of the first and second transconductance amplifiers and the output of the CFIA to chop the outputs of the first and second transconductance amplifiers at the second frequency;
the second frequency being N times the first frequency, where N is an integer.

12. The CFIA of claim 11 further comprising:
a comparator having an input coupled to the output of the CFIA;
second circuitry coupled to an output of the comparator and to the output of the CFIA, the second circuitry chopping an output signal of the CFIA at the first frequency and coupling the chopped output signal of the CFIA to a gain control input of the first and/or second transconductance amplifiers with a polarity responsive to an output of the comparator.

13. The CFIA of claim 12 wherein the output of the second circuitry is coupled to a gain control input of the first and/or second transconductance amplifiers through a first integrator.

14. The CFIA of claim 13 wherein the first integrator is an analog integrator.

15. The CFIA of claim 13 wherein the first integrator is a digital integrator preceded by an analog to digital and followed by a digital to analog.

16. The CFIA of claim 15 wherein the operation of the first integrator is frozen in a region around a zero output of the CFIA.

17. The CFIA of claim 12 further comprising:
an oscillator coupled to the first and second circuitry and to the first chopper for causing the first circuitry to chop the differential signal input and the differential feedback input a full number N of chopper clock cycles at a second frequency, then swap the differential inputs of the first and second transconductance amplifiers between the chopped differential signal input and the chopped differential feedback input, respectively, and again chop the differential signal input and the differential feedback input the same full number N of chopper clock cycles at the second frequency, to provide the second frequency to the first chopper, and to provide the first frequency to the second circuitry.

18. The CFIA of claim 12 wherein the first circuit comprises second through fifth choppers, the second and third choppers having their differential inputs coupled to the differential signal input and the fourth and fifth choppers having their differential inputs coupled to the differential feedback signal, the second and fourth choppers having their differential outputs coupled to the differential input of the first transconductance amplifier and the third and fifth choppers having their differential outputs coupled to the differential inputs of the second transconductance amplifier, the second and fifth choppers being operated simultaneously at the second frequency while the third and fourth choppers are inactive, and the third and fourth choppers being operated simultaneously at the second frequency while the second and fifth choppers are inactive.

19. The CFIA of claim 12 wherein the second circuitry is capacitively coupled to the output of the CFIA.

20. The CFIA of claim 12 wherein the output of the first chopper is coupled to the output of the CFIA through at least one additional transconductance amplifier.

21. The CFIA of claim 12 further comprising:
a second chopper having a differential input coupled to the output of the CFIA and a differential output coupled to a differential integrator, the second chopper chopping a signal on the output of the CFIA at the second frequency;

each of the differential outputs of the differential integrator being coupled to a respective one of the differential outputs of the first and second transconductance amplifiers.

22. The CFIA of claim 21 wherein the differential input of the second chopper is capacitively coupled to the output of the CFIA.

23. The CFIA of claim 21 wherein the differential output of the integrator is coupled to the differential outputs of the first and second transconductance amplifiers through another transconductance amplifier.

24. The CFIA of claim 11 further comprising:
a comparator having a differential input coupled to the output of the CFIA and an output having a comparison output and a counter enable output;
a counter having an enable input coupled to the counter enable output of the comparator and an up/down counter input;
second circuitry coupled to the comparison output of the comparator, to the output of the CFIA and to the up/down counter input, the second circuitry to demodulate a signal at the output of the CFIA at the first frequency and to couple the demodulated signal to the up/down counter input with a polarity responsive to the comparison output of the comparator;
the counter, when enabled, counting up or down responsive the up/down counter input;
a digital to analog converter having an input coupled to the output of the counter and an output being coupled to a gain control input of the first and/or second transconductance amplifiers.

25. The CFIA of claim 24 further comprising:
a second chopper having a differential input coupled to the output of the CFIA and a differential output coupled to an integrator, the second chopper chopping a signal at the output of the CFIA at the second frequency;
each of the differential outputs of the differential integrator being coupled to a respective one of the differential outputs of the first and second transconductance amplifiers.

26. The CFIA of claim 25 wherein the differential input of the second chopper is capacitively coupled to the output of the CFIA.

27. The CFIA of claim 25 wherein the differential output of the integrator is coupled to the differential outputs of the first and second transconductance amplifiers through another transconductance amplifier.

\* \* \* \* \*